(12) United States Patent
Rudolph

(10) Patent No.: US 11,100,262 B2
(45) Date of Patent: Aug. 24, 2021

(54) SUBSTATION VOLTAGE REPLICA BASED ON DIGITAL VOLTAGE

(71) Applicant: Schneider Electric Industries SAS, Rueil-Malmaison (FR)

(72) Inventor: Thomas Rudolph, Rosbach v.d.H. (DE)

(73) Assignee: Schneider Electric Industries SAS, Rueil-Malmaison (FR)

(*) Notice: Subject to any disclaimer, the term of this patent is extended or adjusted under 35 U.S.C. 154(b) by 582 days.

(21) Appl. No.: 15/881,095

(22) Filed: Jan. 26, 2018

(65) Prior Publication Data

US 2018/0239850 A1 Aug. 23, 2018

(30) Foreign Application Priority Data

Feb. 23, 2017 (EP) .................................... 17305195

(51) Int. Cl.
| | |
|---|---|
| *G06F 30/18* | (2020.01) |
| *H02J 1/06* | (2006.01) |
| *H02B 1/24* | (2006.01) |
| *H02J 3/00* | (2006.01) |
| *G06F 30/367* | (2020.01) |
| *G01R 31/327* | (2006.01) |
| *H04L 29/08* | (2006.01) |

(52) U.S. Cl.
CPC ........... *G06F 30/18* (2020.01); *G01R 31/327* (2013.01); *G06F 30/367* (2020.01); *H02B 1/24* (2013.01); *H02J 1/06* (2013.01); *H02J 3/00* (2013.01); *H04L 67/125* (2013.01); *H02J 2203/20* (2020.01)

(58) Field of Classification Search
CPC .... G06F 30/20; H02B 1/24; H02J 1/06; H02J 3/00
See application file for complete search history.

(56) References Cited

U.S. PATENT DOCUMENTS

| | | |
|---|---|---|
| 2002/0059477 A1 | 5/2002 | Wimmer et al. |
| 2009/0005915 A1 | 1/2009 | Wimmer |
| | (Continued) | |

FOREIGN PATENT DOCUMENTS

| | | |
|---|---|---|
| EP | 1 191 662 A1 | 3/2002 |
| EP | 1 819 022 A1 | 8/2007 |
| | (Continued) | |

OTHER PUBLICATIONS

Extended European Search Report dated Sep. 18, 2017 in Patent Application No. 17305195.4, 6 pages.

(Continued)

*Primary Examiner* — Bijan Mapar
(74) *Attorney, Agent, or Firm* — Oblon, McClelland, Maier & Neustadt, L.L.P.

(57) ABSTRACT

A method for determining a digital voltage replica for a substation. The method includes obtaining a substation topology and generating a node model from the substation topology. The generated model represents each switchgear by a pair of two connectivity nodes. The method further includes obtaining switchgear status data and animating the node model. When the node model is animated, the method allows determining a reference node for a target connectivity node. In this manner, a digital voltage replica of a substation is obtained.

14 Claims, 9 Drawing Sheets

| | 0 | 1 | 2 | 3 | 4 | 5 | 6 | 7 | 8 | 9 | 10 | 11 | 12 |
|---|---|---|---|---|---|---|---|---|---|---|---|---|---|
| 0 | | | | | | | 36; O | | | | | | 56; O |
| 1 | | | | 31; O | | | | 41; O | | 51; O | | | |
| 2 | | | | 32; C | | | | | | 42; C | 52; O | | |
| 3 | | 31; O | 32; C | | 33; T | | | | | | | | |
| 4 | | | | 33; T | | 34; CT | | | | | | | |
| 5 | | | | | 34; CT | | 35; C | | | | | | |
| 6 | | 36; O | | | | | 35; C | | | | | | |
| 7 | | 41; O | | | | | | | | | | | |
| 8 | | | 42; C | | | | | | | | | | |
| 9 | | 51; O | 52; O | | | | | | | | 53; O | | |
| 10 | | | | | | | | | | 53; O | | 54; CT | |
| 11 | | | | | | | | | | | 54; CT | | 55; O |
| 12 | 56; O | | | | | | | | | | | 55; O | |

(56) References Cited

U.S. PATENT DOCUMENTS

| | | |
|---|---|---|
| 2009/0125158 A1* | 5/2009 | Schweitzer, III .. G01R 19/2513 700/293 |
| 2010/0161151 A1* | 6/2010 | Yang .................... H02J 3/0073 700/297 |
| 2010/0204948 A1 | 8/2010 | Kirrmann et al. |
| 2010/0325304 A1 | 12/2010 | Wimmer |
| 2011/0320058 A1 | 12/2011 | Rietmann et al. |
| 2012/0023058 A1 | 1/2012 | Mohagheghi et al. |
| 2012/0191959 A1 | 7/2012 | Kumar et al. |
| 2016/0209450 A1 | 7/2016 | Wimmer |

FOREIGN PATENT DOCUMENTS

| | | |
|---|---|---|
| EP | 2 109 204 A1 | 10/2009 |
| EP | 2 264 967 A1 | 12/2010 |
| EP | 2 400 617 A1 | 12/2011 |
| EP | 2 854 337 A1 | 4/2015 |
| WO | WO 2009/053309 A1 | 4/2009 |

OTHER PUBLICATIONS

Bamdad Falahati, et al. "Quantitative Modeling and Analysis of Substation Automation Systems", IEEE PES Transmission and Distribution Conference and Exposition, XP032225147, 2012, pp. 1-7.

Lin Zhu, et al. "IEC 61850-Based Information Model and Configuration Description of Communication Network in Substation Automation", IEEE Transactions on Power Delivery, vol. 29. No. 1, XP011537880, 2014, pp. 97-107.

Mohammad Golshani, et al. "Simulation of Power System Substation Communications Architecture Based on IEC 61850 Standard", Proceedings from the 49th IEEE International Universities Power Engineering Conference (UPEC), XP032666411, 2014, pp. 1-6.

Byunghun Lee, et al. "Harmonizing IEC 61850 and CIM for connectivity of substation automation", Computer Standards and Interfaces, vol. 50. No. 2017, XP029825774, 2016, pp. 199-208.

Vibor Belašić, et al. "The Impact of New Standards and New Technological Solutions on Process Information Modelling", Proceedings from the $16^{th}$ IEEE Mediterranean Electrotechnical Conference (MELECON), XP032179709, 2012, pp. 253-256.

Johan König, et al. "Mapping the Substation Configuration Language of IEC 61850 to ArchiMate", Proceedings from the $14^{th}$ IEEE International Enterprise Distributed Object Computing Conference Workshops (EDOCW), XP031795845, 2010, pp. 60-68.

* cited by examiner

Fig. 4

SUBSTATION VOLTAGE REPLICA BASED ON DIGITAL VOLTAGE

The present invention relates to a digital substation voltage replica, and a method for obtaining a digital substation Voltage replica.

BACKGROUND

In substations of the electricity grid circuit breakers and disconnectors are used for switching high voltage components. This may be under load conditions and no-load conditions. In addition to switching on/off of a load, circuit breakers are capable of switching on/off in case of short circuit currents. Under load conditions, prior to switching or connecting different power lines, checks are performed to ensure safe and reliable operation during and/or after switching. In particular, when power systems on each side of the circuit breaker are to be connected, these may not be synchronous regarding frequency, voltage and/or phase angle. Thereto control signals are derived from the actual power or voltage lines using Voltage Transformers (VT). This requires expensive voltage transformers for each power line to be checked, but as the external powerline will be the same for all or at least some voltage transformers a single reference may be provided by a common ring-wire which may be used for all. However, depending on the size of the substation the cable length required for implementing a network of ring-wires, each representing a particular reference signal, may become extensive and correspondingly expensive.

To reduce cost, such voltage transformers may be replaced by Low Power Voltage Transformers (LPVT). However, as the signals thereof are not suited/powerful enough to be switched to/shared among a common single ring-wire, an additional amplifier is necessary, negating the previously achieved cost reductions.

In both cases, the use of one or more ring-wires provides a hardwired solution wherein the location of the Voltage Transformer and the reference signal are directly linked.

IEC 61850 defines a standard of communication for automation in substations. Logical devices are representing a set of automation, protection or other functions including all relevant information of the High Voltage equipment like switchgear. One or more logical devices could be hosted by an Intelligent Electronic Device (IED). Each logical device in turn includes one or more logical nodes that each represent a functional capability of the logical device. In addition, logical nodes may be created to provide application functions, such as RSYN, MMXU, RDIR. Data Objects may be assigned to each logical node for holding data and attributes, such as parameters, status and further properties. which can be exchanged between logical nodes.

The IEC 61850 standard further prescribes the measurement and communication of sampled values (SV)—as a substitute for the derived analog signals. These sampled signals are obtained from Voltage Transformers, whether a LPVT or conventional, via a sampled signal generator, commonly referred to as merging unit. These sampled signals may be easily communicated via common Ethernet cables. Implementation of the IEC 61850 standard for providing the reference signal could replace the communicating and distribution of the reference signal via the ring-wire. However, the direct link between the sampled signal and the location where the signal originated is lost. Thus, in order to ensure that a specific signal represents a particular switching point in the substation when implementing IEC61850, the location i.e. origin of the sampled signal values needs to be retrievable. This could be done by equipping each switching point with its' own VT or LPVT and merging unit and encoding accordingly, or via a ring-wire necessitating one or more amplifiers and encoding which switchgear is connected to which ring-wire.

To further reduce costs, there is a desire to reduce the number of components and to eliminate the need for an amplifier in combination with LPVT and ring-wire.

SUMMARY OF INVENTION

It is an object of the invention to reduce the footprint and/or the number of components required for protection, control and measurement functions within the substation.

According to one aspect, there is provided a method for determining a digital voltage replica for a substation. The method includes obtaining a substation topology and generating a node model from the substation topology. Wherein the generated model represents each switchgear by a pair of two connectivity nodes. The method further includes obtaining switchgear status data and animating the node model. When the node model is animated, the method allows determining a reference node for a target connectivity node. In this manner, a digital voltage replica of a substation is obtained.

Thus, by taking advantage of the topology of the substation being digitally available, the method allows to determine a path to find a Voltage Transformer indicating a reference voltage level.

According to another aspect, there is provided a substation model having at least two logical devices each representing a physical device of a substation, each logical device having one or more logical nodes. And wherein each logical node represents a functional capability of the logical device, and having assigned data objects containing attributes for the functional capability. The model further includes at least one proxy logical node for gathering sampled value data streams and selecting one thereof for transmitting.

According to another aspect, a computer implemented method, computer program product and a data carrier are provided.

BRIEF DESCRIPTION OF THE DRAWINGS

By way of example only, the embodiments of the present disclosure will be described with reference to the accompanying drawing, wherein:

FIG. 4 illustrates a visualization of a node model generated for the substation of FIG. 1;

DETAILED DESCRIPTION

In this application, the term switchgear may refer to disconnector switches, circuit breakers, circuit switches, load switches or any other type of equipment capable of redirecting or disconnecting power lines, current lines or voltage lines.

A substation may comprise various Intelligent Electronic Devices (IEDs), micro-processor based controllers, PLCs or other devices capable of providing a Utility Communication Architecture.

Substation equipment may be organized in bays connected via one or more busbars. The term bay in general is used to denote a part of a substation containing switchgear and control-gear relating to a particular given circuit. The term feeder bay in particular is used to denote a bay of a substation that relates to a feeder or a link to a transformer, a generator or another substation. For details see e.g. the glossary of IEC 60050.

As mentioned above the IEC61850 standard enables communication over internet, which includes the Open System interface (OSI) model, or a reduced model variant thereof. In order to link components at the physical layer to data at the application layer, data packets use headers for identification. In the case of voltage transformers VT, a header field SV APPID is used to identify these.

Application functions common to substation control included RSYN, MMXU, RDIR. Each of these functions may benefit from a digital voltage replica being available for use. Definition of these functions may found in literature relating to IEC 61850. For convenience, these are briefly described below.

RSYN is aa function that produces a closing for a circuit breaker closing command for connection two circuits whose voltages are within prescribed limits of magnitude, phase angle, and frequency.

MMXU is a function for acquiring values from CTs and VTs and calculate measurands like RMS values for current and voltage or power flows out of the acquired voltage and current samples.

RDIR is a function used for representing directional data objects in a dedicated LN used for directional relay settings.

Figure 1:
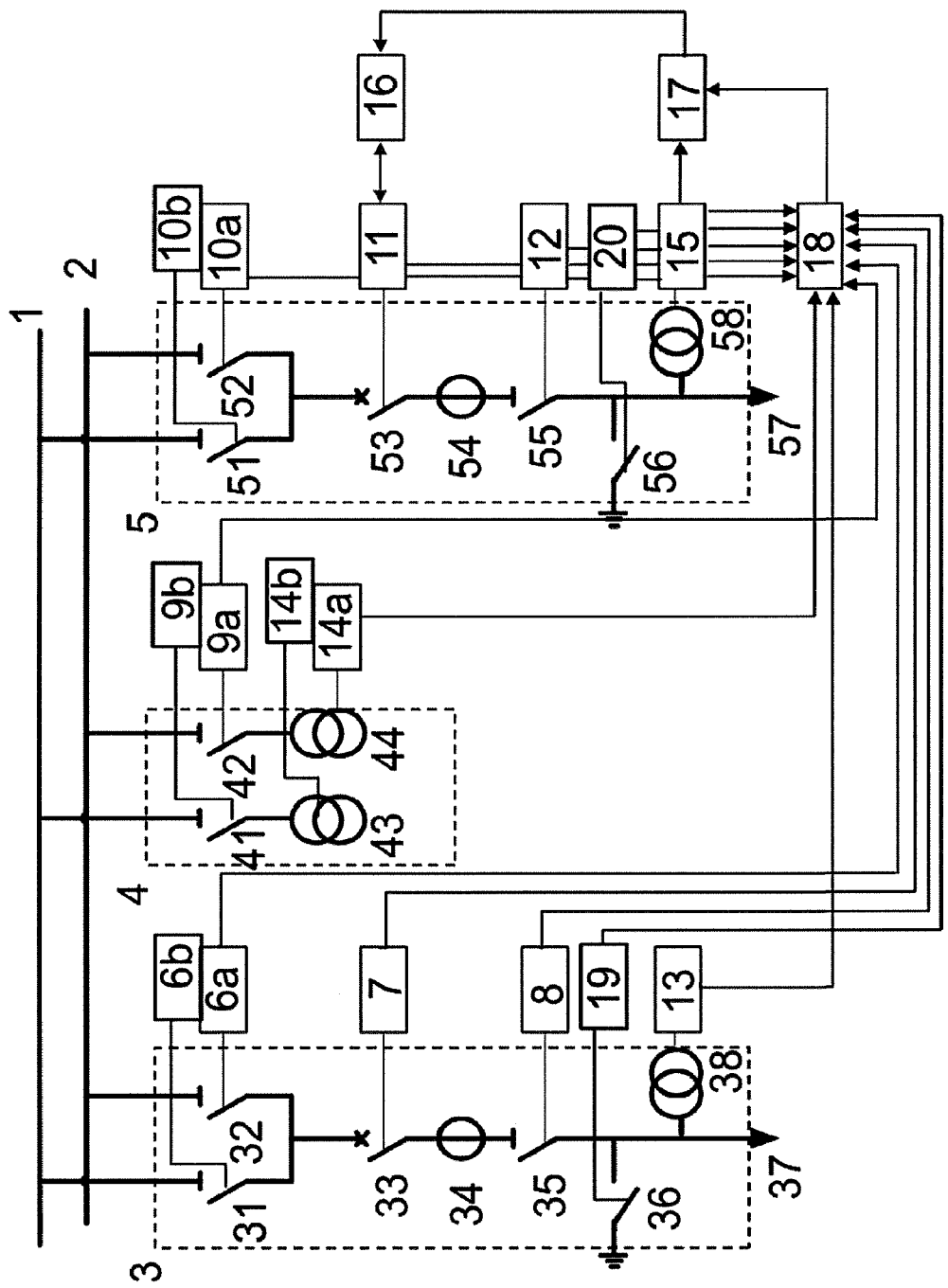
FIG. 1 shows an example of a single line diagram and logical nodes for a substation.

Referring to FIG. 1, a representation of an example of a substation is shown as a single line diagram and logical nodes. Part of these logical nodes are associated with switchgear components. Further logical nodes relate to application functions.

The single line diagram shows two busbars 1, 2 arranged in a double busbar scheme. Connected to the double busbar are three feeder bays 3, 4, 5, each feeder bay 3, 4, 5 being connected to the first busbar 1 via respective disconnector switches 31, 41, 51 and to the second busbar via respective disconnector switches 32, 42, 52.

Feeder bay 3 further has a circuit breaker 33, a current transformer 34, a disconnector switch 35, an earthing switch 36, a feeder input 37, and a voltage measurement transformer 38. Feeder bay 4 further has two voltage measurement transformers 43, 44. Feeder bay 5 further has a circuit breaker 53, a current transformer 54, a disconnector switch 55, an earthing switch 56, a feeder input 57, and a voltage measurement transformer 58.

Each switchgear is associated/controlled with a logical node. Thus, the disconnector switches 31, 32 are controlled via circuit switch logical nodes 6a and 6b, circuit breaker 33 is controlled via circuit breaker logical node 7 and disconnector switch 35 is controlled via circuit switch logical node 8. Similarly, the disconnector switches 41, 42 are controlled via circuit switch logical nodes 9a and 9b. And the disconnector switches 51, 52 are controlled via circuit switch logical nodes 10a and 10b, circuit breaker 53 is controlled via circuit breaker logical node 11 and disconnector switch 55 is controlled via circuit switch logical node 12. For sake of clarity, the connections of logical nodes 6a and 6b to the proxy logical node 18 have been represented by a single line. Similarly, for logical nodes 9a and 9b, for logical nodes 14a and 14b, and for logical nodes 10a and 10b.

The representation of the substation further includes voltage measurement transformer logical nodes (TVTR) 13, 15 connected to respectively voltage measurement transformers 38 and 58. And two logical nodes 14a and 14b connected to voltage measurement transformers 43, 44 respectively. Further included are a switch controller logical node 16, a Synchro Check logical node (RSYN) 17, and a proxy logical node 18.

Figure 2:
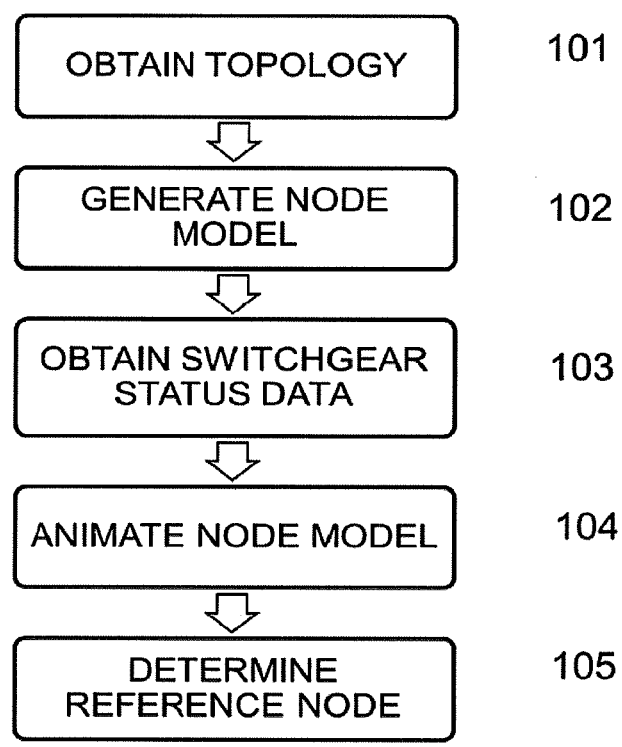
FIG. 2 illustrates schematically an example of a method for determining a voltage replica in accordance with the invention.

Referring to FIG. 2, an example is shown of a method for determining a digital voltage replica. The method starts out by obtaining a substation topology 101, in this example of the substation represented in FIG. 1. Within the IEC 61850 framework, the topology may be e.g. obtained from the substation section of a .SCD or .SSD file which comply with standard configuration file formats.

From the topology a node model is generated 102, wherein each switchgear is represented by a pair of two connectivity nodes. In addition, switchgear status data is obtained 103. In this example, the switchgear data is obtained after generating the node model 102. In other examples, the switchgear data may be obtained prior to generating the node model 102 or it may be performed simultaneously. Generation 102 of the node model may be performed during the engineering process wherein the substation is set up, while obtaining 103 switchgear status may be performed during run-time. As the status of switchgear may alter in operation of the substation, this data may need to be updated during runtime. Whereas in the engineering process indicating the link between the switchgear and the voltage replica would be sufficient.

When the node model is generated and the switchgear status data is available, the node model can be animated 104. This includes indicating for each pair of connectivity nodes whether there is a connection, depending on the status of the switchgear, which e.g. may be indicated as being 'open' or 'closed'.

When the node model is animated 104, at least one reference node can be determined for a target connectivity node. The target connectivity node may be selected in support of a particular application function, such as RSYN, MMXU or RDIR. It may also be predetermined by such function.

Figure 3:
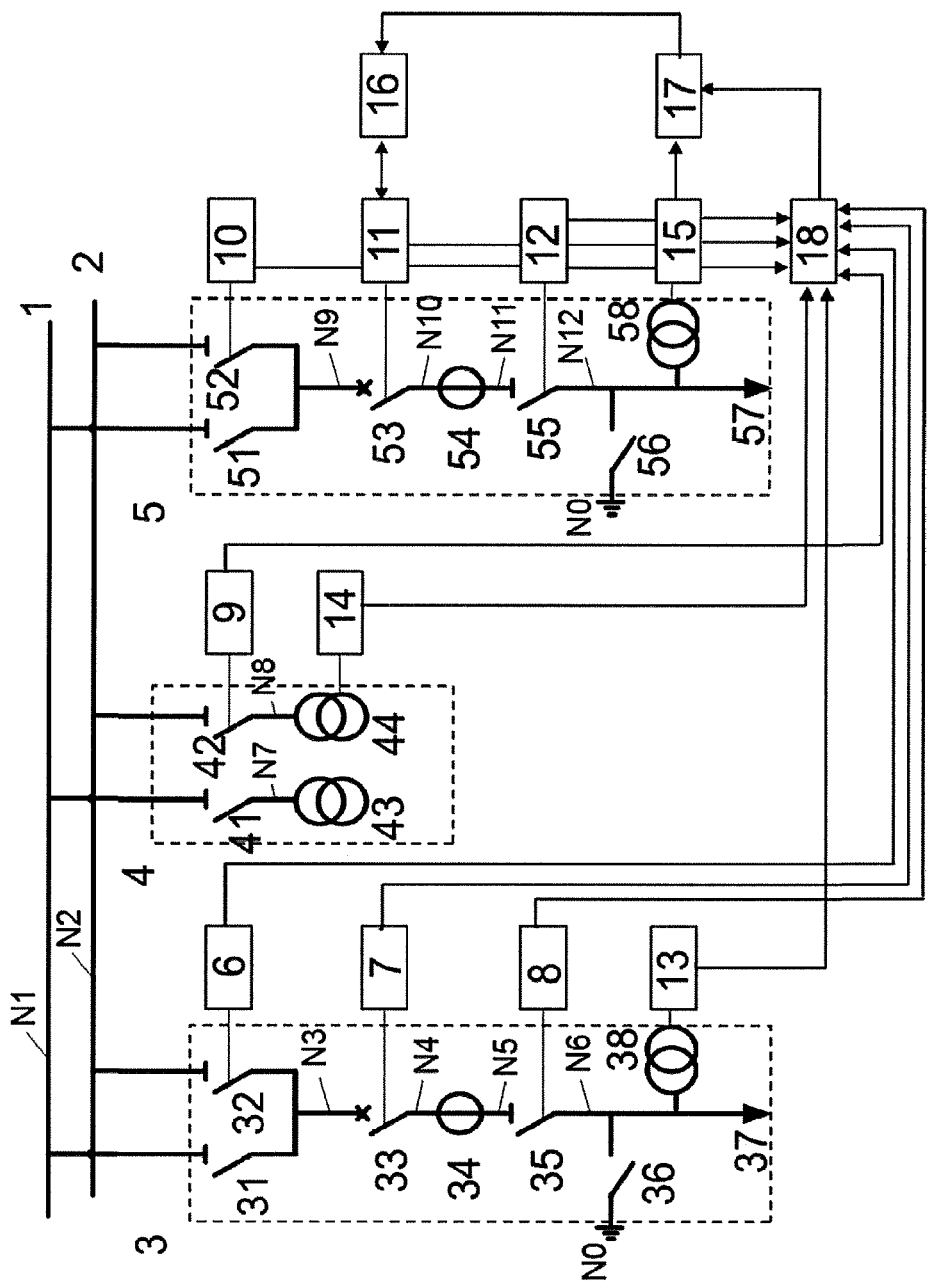
FIG. 3 shows the single line diagram of FIG. 1 including an example of numbering connectivity nodes.

Turning to FIG. 3, the method is described in more detail. FIG. 3 shows the same topology as FIG. 1, wherein for sake of clarity not all logical nodes present in FIG. 1 are shown. In addition, the logical nodes 6a and 6b are represented as a single element 6. Similarly, for logical nodes 9a and 9b being represented by element 9, logical nodes 10a and 10b being represented by element 10, and logical nodes 14a and 14b being represented by element 14

With the topology as shown in FIG. 1 obtained, connectivity nodes are identified and numbered, in this example running from N0 to N12. A connectivity node is a point in the single line diagram representing a common potential.

These nodes may be located between two different components or between a component and an input/output. Likewise, each component is associated with two connectivity nodes on either side of the component. For example, the circuit breaker 33 is located between the two nodes N3 and N4. And current transformer 34 is located between nodes N4 and N5. Thus, each component may be represented by one pair of connectivity nodes, such as N3-N4 for circuit breaker 33 or N4-N5 for the current transformer 34. And in particular, each switchgear present is represented by one respective pair of connectivity nodes. All connections terminating to earth i.e. ground may be represented by the same node as e.g. N0.

Accordingly, the node model of the substation of FIG. 1 may be generated. In the single line diagram of FIG. 3, the node model may be seen as combined strings of consecutive pairs of connectivity nodes, leaping from one pair to a next. The node model may also be visualized as a matrix, as shown in FIG. 4.

Figure 4:
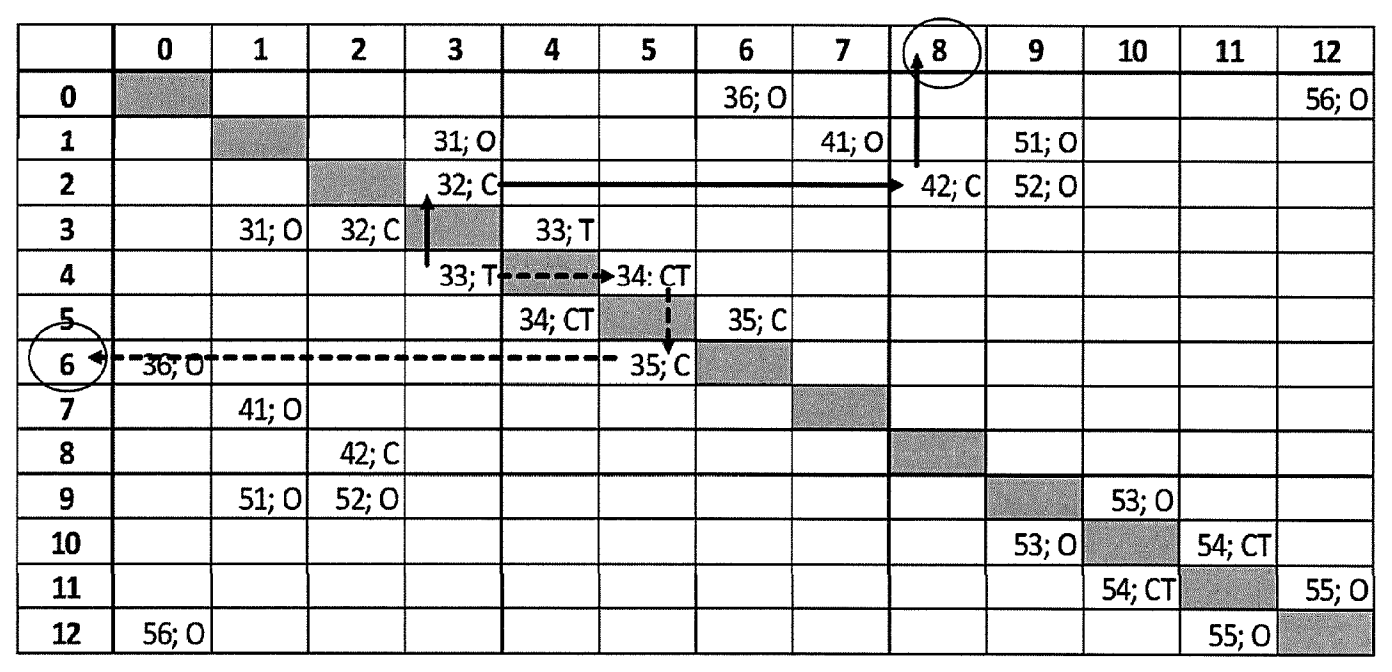

The visual representation of the model in FIG. 4 shows all nodes in both the rows and columns. Each cell i.e. position of the matrix shows whether two nodes are connected via a component; if empty no component is present. With the model generated, the status of each switchgear may be obtained and may be indicated as OPEN by "O" or CLOSED by "C". By storing the status for each connectivity pair representing switchgear, the node model is animated.

To obtain a reference voltage for a specific target node, as for example required for a specific application function, the relevant connectivity node that is associated with a voltage transformer needs to be determined. It requires a path search from target node to reference Voltage Transformer. This may be done by starting at a first connectivity pair comprising the target node and moving via the complementary i.e. counterpart node of the first connectivity pair to a next second connectivity pair. And consecutively moving on from this second connectivity pair to a next third connectivity pair. This moving from one connectivity pair to the next is done till a reference node associated with a voltage transformer is reached.

This moving from one connectivity pair to the next is visualized in FIG. 4 to determine the connected Voltage transformers for circuit breaker 33; when for example required to perform a Synchro Check. Suppose switchgears 32, 33, 35 and 42 are CLOSED. And nodes N6, N7, N8 and N12 are connected to Voltage Transformers. The information of which node is connected to a particular voltage transformer may be represented as a VT-vector. Thus the respective nodes, in this example N6-N8 and N12, may be replaced by VT-vectors indicating to which voltage transformer the node relates.

Starting from the connectivity pair N4-N3 representing circuit breaker 33, the column is followed to find the next connectivity pair, N3-N2 representing switchgear 32. From connectivity pair N3-N2 the row is followed to connectivity pair N2-N8 representing switchgear 44. As connectivity node N8 is connected to Voltage Transformer 44, this the first required reference node.

Again starting from the connectivity pair N3-N4 representing circuit breaker 33, now the row is followed to find the next connectivity pair, N4-N5 representing Current Transformer 34. From connectivity pair N4-N5 the column is followed to connectivity pair N5-N6 representing switchgear 35. As connectivity node N6 is connected to Voltage Transformer 38, this the second required reference node.

As shown above, from the node model generated from the topology of the substation, the relevant reference voltages may be obtained. Moreover, in case of more complex topologies the generated node model may be simplified to ease the determination of relevant reference nodes.

Simplifying the node model may include eliminating connectivity nodes associated with current transformers, as these do not influence the voltage level/potential. In the example of FIG. 3, this means removing Current Transformer 34 by eliminating node N5, so node N4 now directs to node N6 via disconnector switch 35. And removing Current Transformer 54 by eliminating node N10, so node N9 now directs to node N11 via disconnector switch 55.

Simplifying the node model further may include eliminating connectivity nodes associated with earthing switches, as these set potential to zero. In the example of FIG. 3, this means removing earthing switches 36 and 56 by eliminating node N0.

Further simplification may include eliminating connectivity nodes associated with power transformers. As power transformers may be considered as boundary equipment separating voltage levels. And simplification may include checking whether each voltage transformer is associated with a single connectivity node. As Voltage Transformers are considered as boundary equipment having one connectivity node and may be represented by a VT vector.

Figure 5:
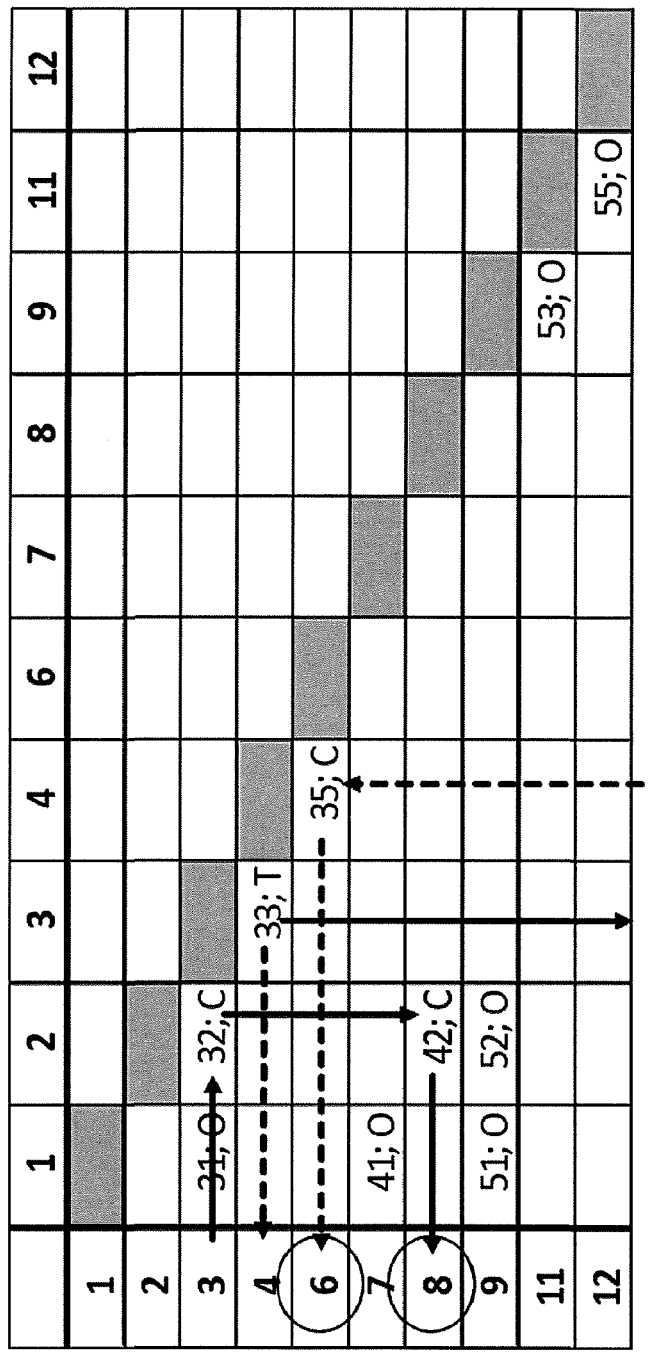
FIG. 5 illustrates a visualization of a simplified version of the node model of FIG. 4.

A resulting simplified node model may be represented visually as shown in FIG. 5. In this example, further advantage for simplifying the model before determining reference nodes is taken from the symmetry of the matrix representation. Thereby reducing the matrix to a diagonal matrix. The arrows still indicate the path travelled to the relevant reference nodes.

In the method as described a static mode of operation is assumed, meaning that changes in switchgear positions should trigger requests for re-animation i.e. re-calculation of the node model. Note that though the node model has been visually represented as a matrix, other ways of storing, processing and representing the node model may be used, such as e.g. string data sets or other data types, which may for example be more suited for parallel processing.

The method as disclosed may be computer implemented in Intelligent Electronic Devices or other equipment being part of the automated control system of the substation. The method may be implemented in a dedicated proxy TVTR logical node, as shown in FIG. 1. This allows multiple application nodes to subscribe to the proxy TVTR and hence gain access to the voltage replica obtained by the method. In this manner, the voltage replica will be available for use to any application function.

Figure 6:
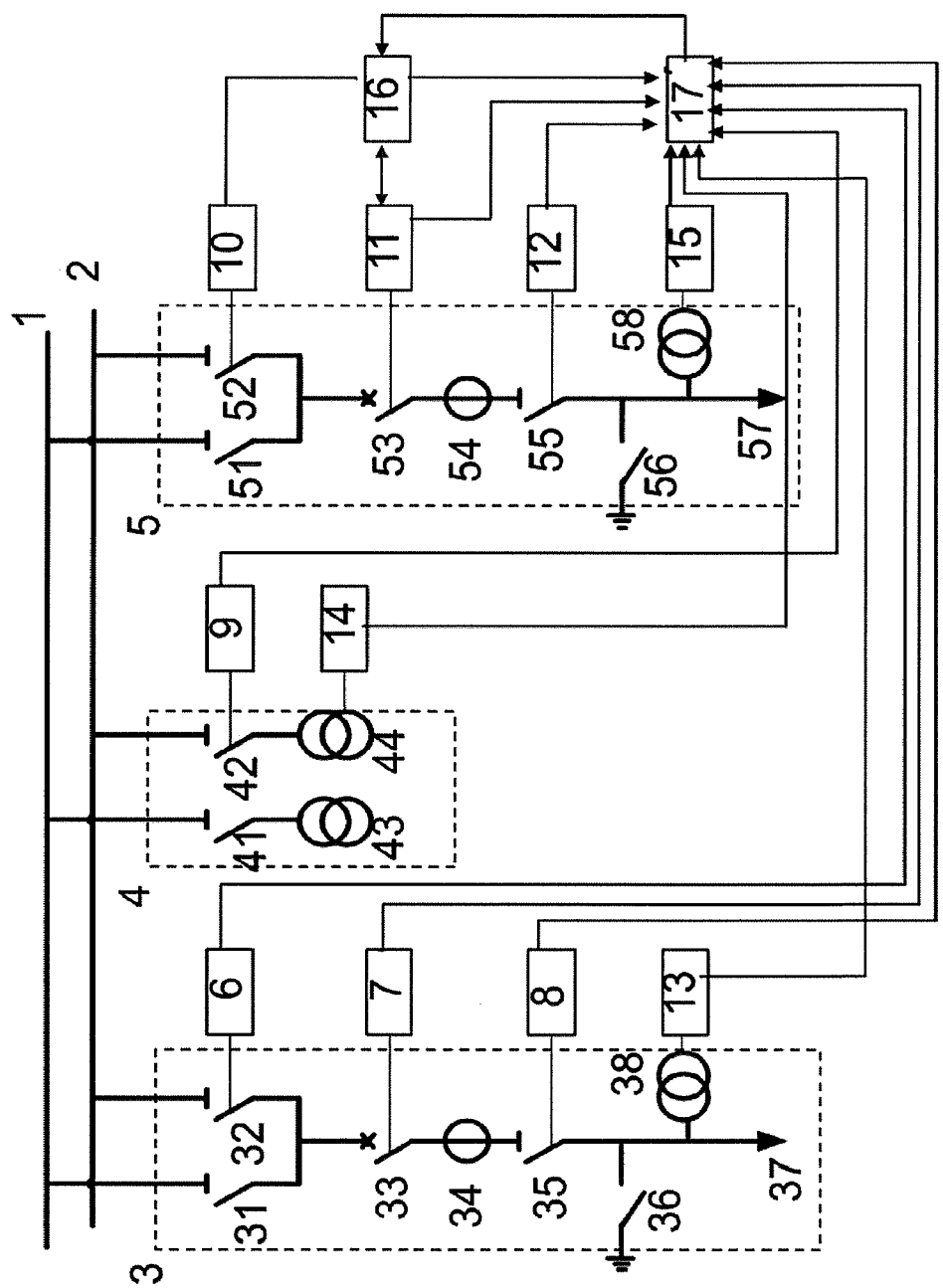
FIG. 6 shows another example of a single line diagram and logical nodes for a substation.

Alternatively, the method may also be computer implemented in the application logical node requiring the voltage replica. Shown in FIG. 6, is another example of a representation of the same substation as in FIG. 1. This shows the same single line diagram and logical nodes as indicated by the same reference signs as shown in FIG. 3. However, in this example, the method is implemented in application logical node 17'.

The method as disclosed allows selecting the reference node and therewith the reference voltage transformer for the target node at the application layer based on the topology. So, depending on the topology configuration the correct APPID or SV may be identified.

Whereas the voltage transformer logical nodes are fixed and only provide one data stream of sampled values, the use of a proxy node enables a flexibility for providing the required sampled value data stream by identification and selection thereof in a logical node not fixed to one particular voltage transformer logical node.

Figure 7:
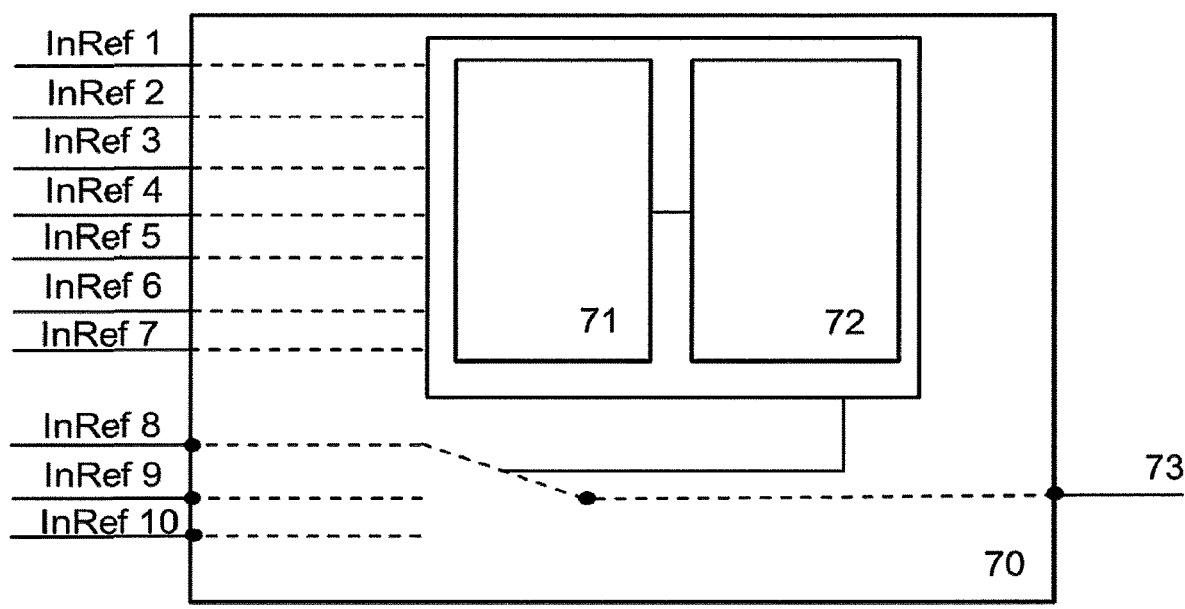
FIG. 7 illustrates schematically an example of a proxy voltage transformer logical node (proxy TVTR) in accordance with the invention.

Turning to FIG. 7, an example of a proxy TVTR logical node is shown in more detail. The proxy node has a function block named substation topology model and a function block named reference TVTR. Switchgear status is provided by the logical nodes of each respective switchgear to the inputs InRef 1-7. Sampled Values coming from the reference TVTR logical nodes are provided to the inputs InRef 8-10. In this example seven inputs for switchgear logical nodes and three for voltage transformers logical nodes are shown, however additional inputs may be provided depending on the number of logical nodes present in the substation model. The proxy TVTR logical node has one output 73 for delivering the required data stream of Sampled Values. However, multiple outputs may be provided, for example when in a centralized architecture additional routing logics are active at the same time.

The function block substation topology model holds the obtained substation topology and generates the node model in which all switchgear devices are organized, including their connectivity nodes representing physical terminals. Simplifying steps of eliminating current transformers, eliminating earthing switches and other simplifications as described above, may be performed on the substation topology node model.

The obtained switchgear status data describing the position indications for all switchgear, viz. "OPEN" or "CLOSED", is processed to animate the generated node model.

The function block reference TVTR is arranged for performing the routing and selection logic that executes the path search for determining the reference Voltage Transformer node or nodes required for a particular application function.

When the correct reference node or nodes are determined, the associated Sampled Values data stream may be selected and delivered via the output 73. In this example, the selection of the Sampled Values data stream is based on the VT vectors associated with the determined reference nodes, which allows to identify the correct SV stream.

Figure 8:
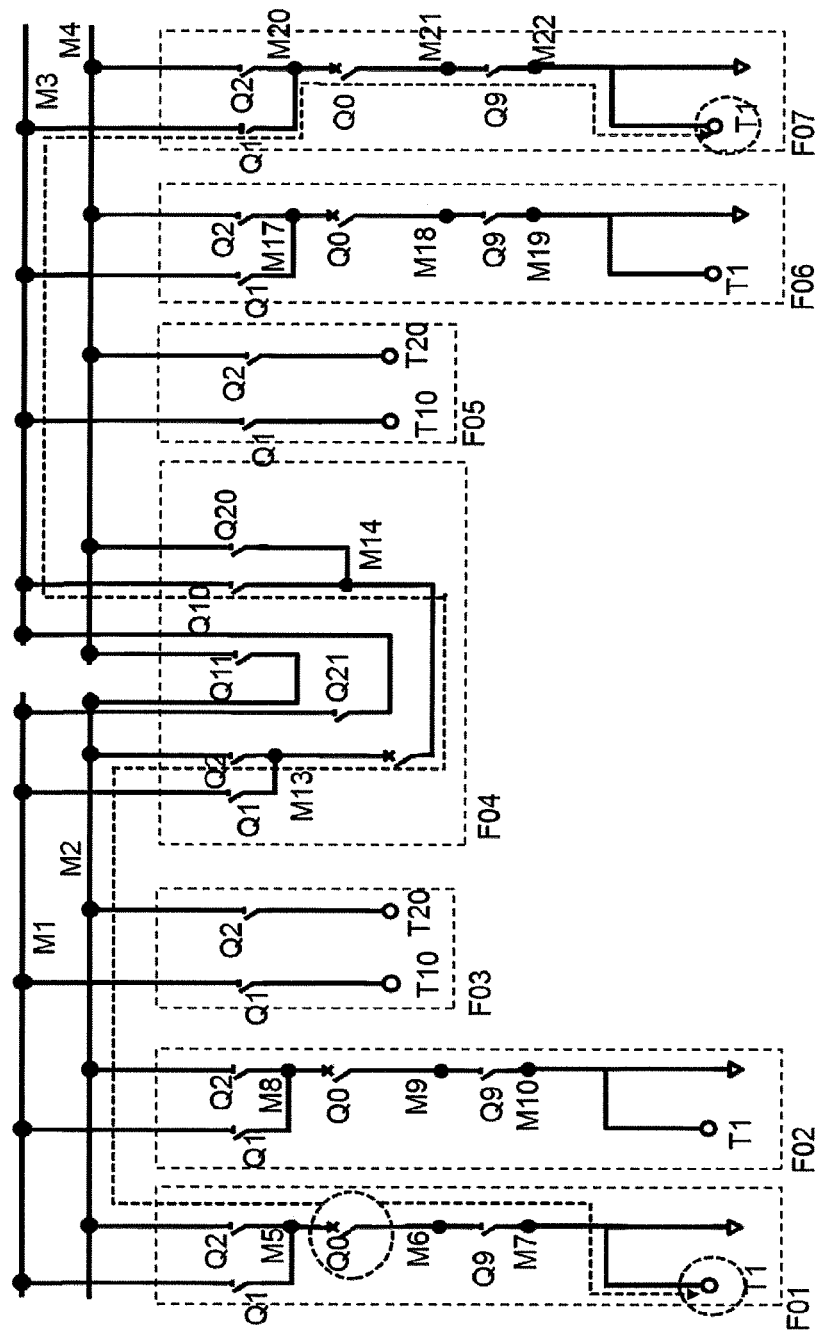
FIG. 8 shows an example of a single line diagram for another substation.

Referring to FIG. 8, an example of a single line diagram of another substation is shown. This substation has two double busbar sections 1, 2 and 3, 4 and connects to seven bays F01-F07, of which F01, F02, F06 and F07 are feeder bays. In this diagram Q0 indicates a circuit breaker, T1, T10 and T20 indicate voltage transformers, and Q1, Q2, Q9, Q10, Q11, Q20 and Q21 indicate disconnector switches. Connectivity nodes are indicated by M1-M22.

Figure 9:
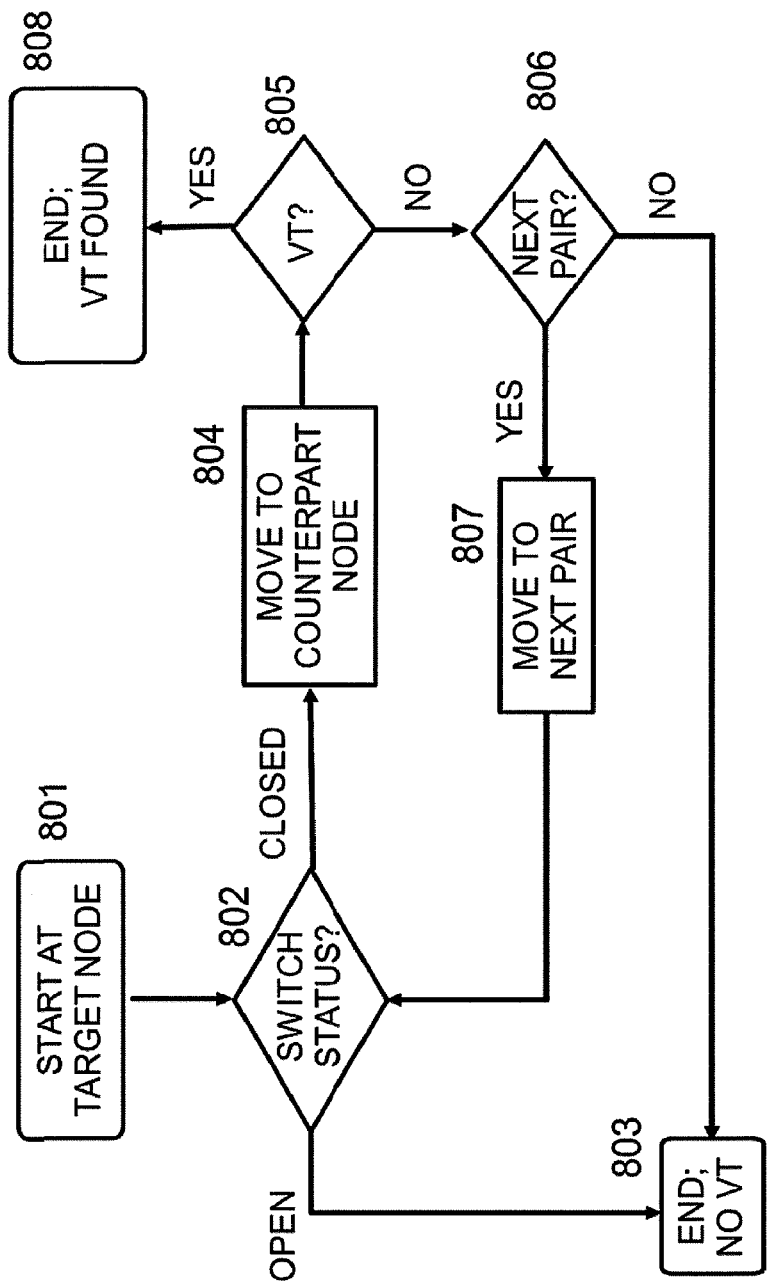
FIG. 9 is an example of a flowchart for determining a reference voltage transformer VT in accordance with the invention.

Turning to FIG. 9, an example of a flowchart is shown for determining a reference voltage transformer VT. The steps of this example flowchart will be discussed while referring to FIG. 8. Suppose the reference nodes for circuit breaker Q0 of feeder bay F01 are required. Starting 801 at target node M6, the switchgear status 802 of disconnector Q9 is checked. It is closed, so move 804 to counterpart node M7. Check for voltage transformer 805, "yes" one is connected, so first reference voltage transformer node for node M6 is found 808.

Starting 801 again, now at target node M5, the switchgear status 802 of disconnector Q1 is checked. It is open, so no path leading to a VT is present; end and restart. Then starting 801 again at target node M5, the switchgear status 802 of disconnector Q2 is checked. It is closed, so move 804 to counterpart node M2. Check for voltage transformer 805, none is connected, so check for next pair 806. In this example, multiple connectivity pairs for node M2 are present which all need to be checked according to the associated switchgear status. For the disconnector switch Q2 of bay F04, the switchgear status is closed, so move to counterpart node M13. No voltage transformer VT 805 is connected, so move to next pair 806, which will be circuit breaker Q0 that is closed. The above steps are repeated along closed disconnector switch Q10 of bay F04 to node M3 of the double busbar. And from node M3 along closed disconnector switches Q1 and Q9 of feeder bay F07 to reference voltage transformer node T1 of feeder bay F07.

Of course, the flowchart of FIG. 9 may be elaborated to include the various repetitions of the scheme as described above. And though the principal of the flowchart may be seen as moving along connectivity pairs based on switchgear status, various other schemes may be implemented to facilitate the path searching. In anyway, determining reference voltage transformers has been shown to be alleviated by the disclosed method for determining a digital voltage replica of a substation.

The method as disclosed, may be present in a substation as a computer program product. The computer program product including instructions or code which, when executed on at least one computer processor, cause the at least one computer processor to carry out the method for determining a digital voltage replica as disclosed.

The method as disclosed, may be stored in a substation on a non-transitory computer readable medium. Or it may be stored on any other computer readable memory device capable of storing executable code for executing instructions according to the disclosed method.

The code stored in memory can be implemented as software and/or firmware to program the processor(s) to carry out actions described above. In certain embodiments, such software or firmware may be initially provided to the computer by downloading it from a remote system through the computer (e.g., via network adapter). In some embodiments, memory and the storage device(s) can be a single entity.

The components introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

Software or firmware for use in the substation may be stored on a machine-readable storage medium and may be executed by one or more general-purpose or special-purpose programmable microprocessors, as for example may be present in HMIs, PLCs, SCADAs, servers, control center or other controllers or processing units. A "machine readable storage medium", as the term is used herein, includes any mechanism that can store information in a form accessible by a machine.

In this context, a non-transitory storage medium may include a device that is tangible, meaning that the device has a concrete physical form, although the device may change its physical state. Thus, for example, non-transitory refers to a device remaining tangible despite this change in state.

The term "logic", as used herein, can include, for example, programmable circuitry programmed with specific software and/or firmware, special-purpose hardwired circuitry, or a combination thereof.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments.

The invention claimed is:

1. A computer implemented method for determining a digital voltage replica of a substation, the substation being represented as a single line diagram having switch gear components, each switchgear component being associated with a logical node, the computer implemented method comprising the steps of:
obtaining a substation topology;
identifying and numbering the connectivity nodes of the topology, each connectivity node being a point in the single line diagram representing a common potential;
generating a node model from the topology, the node model representing a respective switchgear component by a pair of two connectivity nodes, and arranging the connectivity nodes in a symmetric matrix based on unique connectivity node identifiers;
obtaining switchgear status data;
animating the node model, by assigning for each respective switchgear the obtained switchgear data to the respective pair of connectivity nodes;
determining a reference voltage node for a target connectivity node with a path search from the target connectivity node to a reference voltage transformer;
verifying the state of the substation based on the voltage replica prior to connecting and/or disconnecting a high voltage component; and
providing a control signal for connecting and/or disconnecting said high voltage component based on the verified state.

2. The computer implemented method according to claim 1, further comprising:
eliminating connectivity nodes associated with current transformers;
eliminating connectivity nodes associated with earthing switches;
eliminating connectivity nodes associated with power transformers; and
checking each voltage transformer to be associated with a single connectivity node.

3. The computer implemented method according to claim 1, wherein generating a node model comprises:
transforming the node model into a diagonal matrix based on unique connectivity node identifiers.

4. The computer implemented method according to claim 1, wherein determining a reference node for a target connectivity node comprises:
determining at least one connected path between the target node and the reference node.

5. The computer implemented method according to claim 4, wherein determining at least one connected path comprises:
starting at a connectivity pair comprising the target node;
moving via a counterpart node of the node pair to a next node pair;
till a reference node associated with a voltage transformer is reached.

6. The computer implemented method according to claim 5, repeating the steps of claim 5 for each connectivity pair comprising the target node.

7. The computer implemented method according to claim 6, selecting the shortest path from the target node to the nearest reference node.

8. The computer implemented method according to claim 1, wherein generating the model further comprises:
representing power transformers, current transformers and further substation components by pairs of connectivity nodes.

9. The computer implemented method according to claim 1, wherein generating the model further comprises:
representing voltage transformers by one connectivity node.

10. A substation, comprising:
at least two logical devices each representing a physical device of a substation, each logical device comprising one or more logical nodes;
wherein each logical node represents a functional capability of the logical device, each logical node having assigned data objects containing attributes for the functional capability; and
further comprising at least one proxy logical node for gathering sampled value data streams and selecting one thereof for transmitting.

11. The substation according to claim 10, further comprising:
an application logical node performing an application function; and
wherein the application logical node is subscribed to the at least one proxy logical node for receiving selected sampled value data streams.

12. A computer program product, comprising instructions which, when executed on at least one computer processor, cause the at least one computer processor to carry out a method for determining a digital voltage replica of a substation, the substation being represented as a single line diagram having switchgear components, each switchgear component being associated with a logical node,
the method comprising:
obtaining a substation topology;
identifying and numbering the connectivity nodes of the topology, each connectivity node being a point in the single line diagram representing a common potential;
generating a node model from the topology, the model representing a respective switchgear component by a pair of two connectivity nodes, and arranging the connectivity nodes in a symmetric matrix based on unique connectivity node identifiers;
obtaining switchgear status data;
animating the node model by assigning for each switchgear the obtained switchgear data to the respective pair of connectivity nodes;
determining a reference voltage node for a target connectivity node with a path search from the target connectivity node to a reference voltage transformer.

13. The computer program according to claim 12, further comprising instructions to eliminate connectivity nodes associated with current transformers;
eliminate connectivity nodes associated with earthing switches;
eliminate connectivity nodes associated with power transformers; and
check each voltage transformer to be associated with a single connectivity node.

14. A non-transitory computer readable medium storing a computer program product, the computer program product, comprising instructions which, when executed on at least one computer processor, cause the at least one computer processor to carry out a method for determining a digital voltage replica, the method comprising:
  obtaining a substation topology;
  identifying and numbering the connectivity nodes of the topology, each connectivity node being a point in the single line diagram representing a common potential;
  generating a node model from the topology, the model representing a respective switchgear component by a pair of two connectivity nodes, and arranging the connectivity nodes in a symmetric matrix based on unique connectivity node identifiers;
  obtaining switchgear status data;
  animating the node model by assigning for each switchgear the obtained switchgear data to the respective pair of connectivity nodes;
  determining a reference voltage node for a target connectivity node with a path search from the target connectivity node to a reference voltage transformer.

* * * * *